(12) United States Patent
Izumi et al.

(10) Patent No.: US 11,676,995 B2
(45) Date of Patent: Jun. 13, 2023

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Masato Izumi, Nonoichi Ishikawa (JP); Kazutoshi Nakamura, Nonoichi Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/448,166

(22) Filed: Jun. 21, 2019

(65) Prior Publication Data
US 2020/0286989 A1 Sep. 10, 2020

(30) Foreign Application Priority Data
Mar. 8, 2019 (JP) .............................. JP2019-042446

(51) Int. Cl.
*H01L 29/47* (2006.01)
*H01L 29/06* (2006.01)
(Continued)

(52) U.S. Cl.
CPC ........ *H01L 29/0638* (2013.01); *H01L 29/365* (2013.01); *H01L 29/47* (2013.01); *H01L 29/872* (2013.01)

(58) Field of Classification Search
CPC ... H01L 29/0638; H01L 29/365; H01L 29/47; H01L 29/872; H01L 29/0603; H01L 29/0692; H01L 29/36
(Continued)

(56) References Cited

U.S. PATENT DOCUMENTS 8,395,244 B2  3/2013 Vobecky et al.
8,669,554 B2 *  3/2014 Yu .......................... H01L 29/32
                                                          257/483
(Continued)

FOREIGN PATENT DOCUMENTS

CN  103811561 A  5/2014
JP  H7-147418 A  6/1995
(Continued)

*Primary Examiner* — Meiya Li
(74) *Attorney, Agent, or Firm* — Allen & Overy LLP

(57) ABSTRACT

A semiconductor device includes a semiconductor body, an electrode provided on a surface of the semiconductor body. The semiconductor body includes a first semiconductor layer and a second semiconductor layer provided between the first semiconductor layer and the second electrode. The second semiconductor layer includes first and second regions arranged along the surface of the semiconductor body. The first region has a surface contacting the electrode, and the second region includes second conductivity type impurities with a concentration lower than a concentration of the second conductivity type impurities at the surface of the first region. The second semiconductor layer has a first concentration of second conductivity type impurities at a first position in the second region, and a second concentration of second conductivity type impurities at a second position between the first position and the electrode, the second concentration being lower than the first concentration.

19 Claims, 3 Drawing Sheets

(51) Int. Cl.
  *H01L 29/36* (2006.01)
  *H01L 29/872* (2006.01)
(58) Field of Classification Search
  USPC .................................................. 257/475–478
  See application file for complete search history.

(56) References Cited

U.S. PATENT DOCUMENTS

| | | | |
|---|---|---|---|
| 2005/0173739 A1* | 8/2005 | Kusumoto | H01L 29/812 |
| | | | 257/263 |
| 2012/0056178 A1* | 3/2012 | Han | H01L 23/5256 |
| | | | 257/E23.002 |
| 2012/0056198 A1 | 3/2012 | Ota et al. | |
| 2014/0077226 A1* | 3/2014 | Kitani | H01L 29/0619 |
| | | | 257/77 |
| 2014/0124832 A1 | 5/2014 | Ogura et al. | |
| 2015/0069414 A1* | 3/2015 | Kono | H01L 29/872 |
| | | | 257/77 |
| 2016/0315203 A1* | 10/2016 | Uchida | H01L 29/0692 |

FOREIGN PATENT DOCUMENTS

| | | | |
|---|---|---|---|
| JP | 2010-73857 A | | 4/2010 |
| JP | 2012-059902 A | | 3/2012 |
| JP | 5769950 B2 | | 8/2015 |
| JP | 2016162776 A | * | 9/2016 |
| JP | 2016-208030 A | | 12/2016 |

\* cited by examiner

SEMICONDUCTOR DEVICE

CROSS-REFERENCE TO RELATED APPLICATIONS

This application is based upon and claims the benefit of priority from Japanese Patent Application No. 2019-042446, filed on Mar. 8, 2019; the entire contents of which are incorporated herein by reference.

FIELD

Embodiments described herein relate generally to a semiconductor device.

BACKGROUND

When switching a semiconductor device from ON state to OFF state, shortening the period for eliminating carriers, for example, holes in the semiconductor is required to reduce a switching loss. For this purpose, trap levels that act as carrier killers are formed in the semiconductor to shorten the life time of holes. However, the trap levels make current leakage increase in the OFF state. Thus, it is desired to reduce the carrier amount injected into the semiconductor while suppressing the increase of ON resistance.

DETAILED DESCRIPTION

Figure 1A:
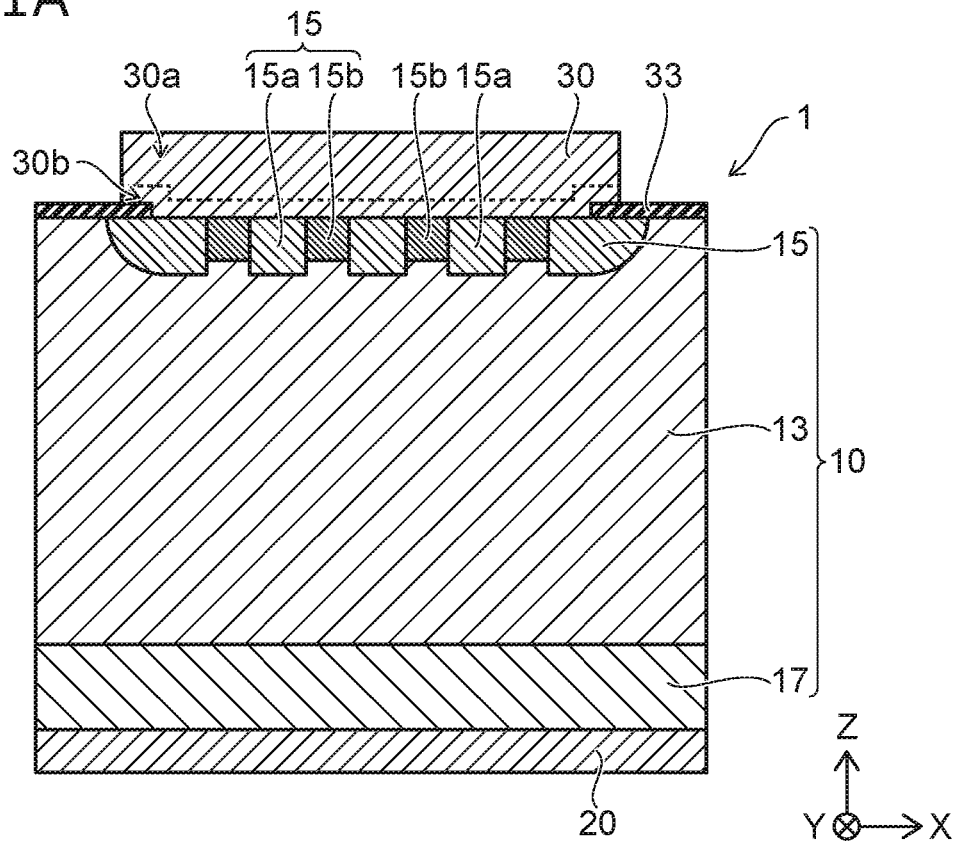
FIGS. 1A and 1B are schematic views showing a semiconductor device according to a first embodiment.

According to one embodiment, a semiconductor device includes a semiconductor body including a first semiconductor layer of a first conductivity type; a first electrode provided on a back surface of the semiconductor body; and a second electrode provided on a front surface of the semiconductor body. The semiconductor body further includes a second semiconductor layer of a second conductivity type provided between the first semiconductor layer and the second electrode. The second semiconductor layer includes a first region and a second region arranged along the front surface of the semiconductor body. The first region includes second conductivity type impurities, and has a front surface contacting the second electrode. The first region is electrically connected to the second electrode. The second region includes second conductivity type impurities with a concentration lower than a concentration of the second conductivity type impurities at the front surface of the first region. The second semiconductor layer has a first concentration of the second conductivity type impurities at a first position in the second region and a second concentration of the second conductivity type impurities at a second position between the first position and the second electrode. The second concentration is lower than the first concentration.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

Figure 1B:
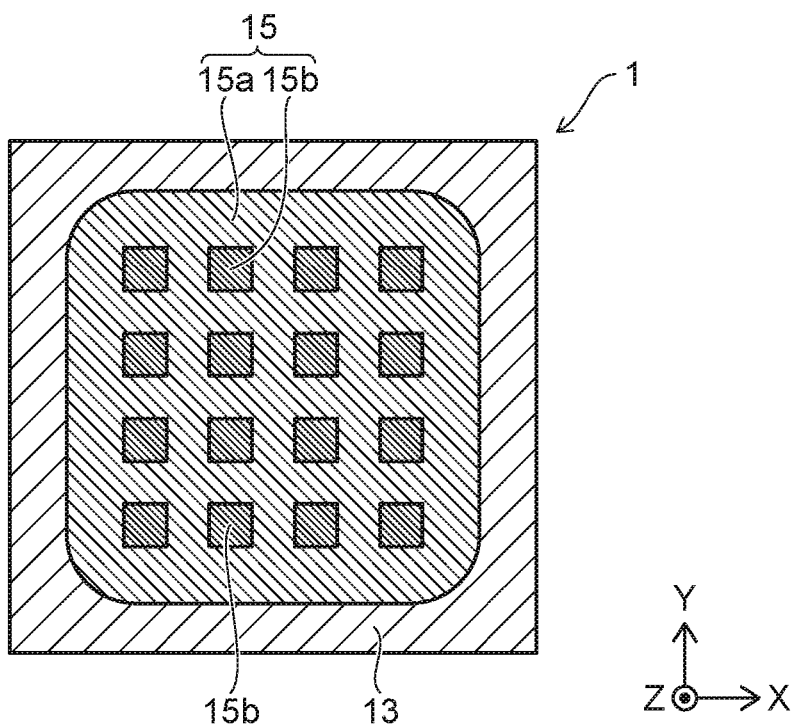

FIGS. 1A and 1B are schematic views showing a semiconductor device 1 according to a first embodiment. FIG. 1A is a schematic cross sectional view showing the semiconductor device 1. FIG. 1B is a plan view.

As shown in FIG. 1A, the semiconductor device 1 includes a semiconductor body 10, a cathode electrode 20 (a first electrode), and an anode electrode 30 (a second electrode). The semiconductor body 10 is, for example, made of silicon. The cathode electrode 20 is provided on a back surface of the semiconductor body 10. The anode electrode 30 is selectively provided on a front surface of the semiconductor body 10.

The semiconductor body 10 includes an n-type semiconductor layer 13 (a first semiconductor layer), a p-type semiconductor layer 15 (a second semiconductor layer), and an n-type semiconductor layer 17. The n-type semiconductor layer 17 is provided between the n-type semiconductor layer 13 and the cathode electrode 20. The n-type semiconductor layer 17 includes n-type impurities with a higher concentration than an n-type impurity concentration in the n-type semiconductor layer 13. The cathode electrode 20 contacts the n-type semiconductor layer 17 and is electrically connected thereto. The cathode electrode 20 includes, for example, gold germanium alloy.

The p-type semiconductor layer 15 is provided between the n-type semiconductor layer 13 and the anode electrode 30. The p-type semiconductor layer 15 is selectively provided on the front surface side of the semiconductor body 10. The p-type semiconductor layer 15 includes, for example, boron (B) which is a p-type impurity. The anode electrode 30 is electrically connected to the p-type semiconductor layer 15 and includes, for example, aluminum or titanium.

The p-type semiconductor layer 15 includes a first region 15a and a second region 15b arranged in a direction parallel to the front surface of the semiconductor body 10. The first region 15a has a thickness in the Z-direction, for example, thicker than a thickness of the second region 15b in the Z-direction.

The n-type semiconductor layer 13 surrounds the p-type semiconductor layer 15 at the front surface of the semiconductor body 10. The n-type semiconductor layer 13 and the p-type semiconductor layer 15 provide a pn junction at the boundary thereof. An insulating film 33 is provided on the front surface of the semiconductor body 10. The insulating film 33 serves as a protection film that covers the n-type semiconductor layer 13. The insulating film 33 is provided so as to cover the periphery of the pn junction exposed at the front surface of the semiconductor body 10. The insulating film 33 is, for example, a silicon oxide film.

The anode electrode 30 is provided to contact the first region 15a and the second region 15b. For example, the first region 15a includes p-type impurities with a higher concentration than a p-type impurity concentration in the second region 15b. Thus, a contact resistance between the first region 15a and the anode electrode 30 is lower than a contact resistance between the second region 15b and the anode electrode 30. For example, Ohmic contact is formed between the first region 15a and the anode electrode 30, whereas Schottky contact, for example, is formed between the second region 15b and the anode electrode 30.

FIG. 1B is a schematic plan view showing an arrangement of the first region 15a and the second region 15b in the p-type semiconductor layer 15.

As shown in FIG. 1B, multiple second regions 15b are arranged in the X-direction and the Y-direction. The first region 15a includes portions placed between the multiple second regions 15b, respectively, and other portion provided to surround the multiple second regions 15b. It should be noted that the embodiment is not limited to this example, and the second regions 15b may be provided, for example, with a stripe shape extending in the Y-direction and arranged in the X-direction.

In the semiconductor device 1, electrons are discharged under a forward bias through the Schottky junction formed at the second region 15b, and thus, it is possible to reduce the density of hole current that flows through the first region 15a. That is, the holes injected into the n-type semiconductor layer 13 are suppressed by providing the second regions 15b, and the carriers are reduced in the n-type semiconductor layer 13. Thereby, it is possible to shorten the turn off period and to reduce the switching loss. The ON resistance and the switching loss can be optimized by setting an appropriate area ratio of the first region 15a to the second region 15b. Further, trap levels may be added by electron beam irradiation, proton irradiation, helium irradiation or the like. According to the embodiment, it is possible to reduce the hole amount injected from the p-type semiconductor layer 15 to the n-type semiconductor layer 13, and thus, the amount of the trap levels can be reduced to suppress the leak current through the trap levels.

Figure 2:
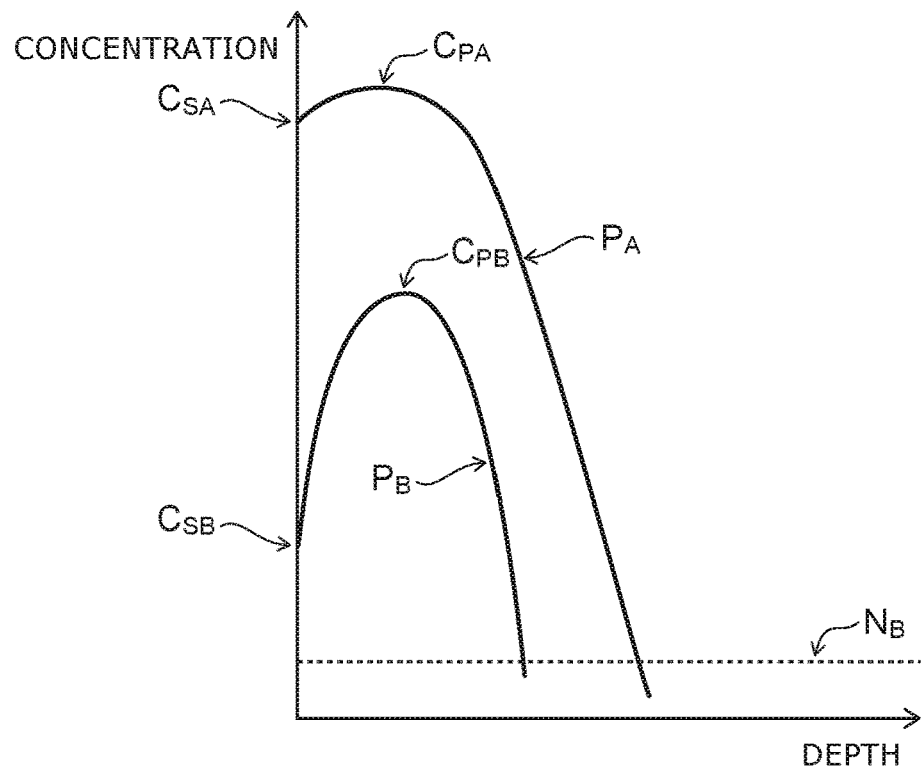
FIG. 2 is a schematic view showing a configuration of the semiconductor device according to the first embodiment.

FIG. 2 is a schematic view showing a configuration in the semiconductor device 1 according to the first embodiment. In FIG. 2, impurity concentration profiles are illustrated to show the distributions of p-type impurities and n-type impurities in the semiconductor body 10. $P_A$ shown in FIG. 2 is the p-type impurity distribution in the first region 15a. $P_B$ is the p-type impurity distribution in the second region 15b. $N_B$ is the n-type impurity concentration in the n-type semiconductor layer 13. $N_B$ is, for example, equal to or less than $1 \times 10^{16}$ cm$^{-3}$.

As shown in FIG. 2, the first region 15a has a peak concentration $C_{PA}$ of the p-type impurity distribution. The second region 15b has a peak concentration $C_{PB}$ of the p-type impurity distribution. The peak concentration $C_{PA}$ of the p-type impurity in the first region 15a is higher than the peak concentration $C_{PB}$ of the p-type impurity in the second region 15b. The peak concentration $C_{PA}$ is, for example, in a range of $1 \times 10^{18}$ to $1 \times 10^{19}$ cm$^{-3}$. The peak concentration $C_{PB}$ is, for example, in a range of $1 \times 10^{16}$ to $1 \times 10^{18}$ cm$^{-3}$.

The first region 15a has a surface concentration $C_{SA}$ of the p-type impurity, and the second region 15b has a surface concentration $C_{SB}$ of the p-type impurity. The surface concentration $C_{SB}$ is less than the peak concentration $C_{PB}$. The surface concentration $C_{SB}$ is, for example, equal to or less than one-tenth the surface concentration $C_{SA}$. The surface concentration $C_{SB}$ is, for example, equal to or less than $1 \times 10^{17}$ cm$^{-3}$. Furthermore, the surface concentration $C_{SA}$ in the first region 15a is higher than the peak concentration $C_{PB}$ in the second region 15b. The surface concentration $C_{SA}$ is the same as the peak concentration $C_{PA}$ or is lower than the peak concentration $C_{PA}$. The second region 15b has a peak of the p-type impurity distribution that is positioned at a depth away from the surface, and the p-type impurity concentration in the second region 15b is lower than the peak concentration $C_{PB}$ between the peak position of the p-type impurity concentration in the second region 15b and the anode electrode 30.

The first region 15a and the second region 15b are formed, for example, by selectively ion-implanting the p-type impurities into the n-type semiconductor layer 13. Then, the p-type impurity amount implanted into the region that is to be the second region 15b is set to be less than the p-type impurity amount implanted into the region that is to be the first region 15a. The p-type impurities implanted into the second region 15b are implanted, for example, under higher acceleration energy as compared to the p-type impurities implanted into the first region 15a. That is, the peak position of the p-type impurity in the second region 15b may be deeper than the peak position of the p-type impurity in the first region 15a.

As described above, the hole injection into the n-type semiconductor layer 13 under the forward bias can be suppressed in the semiconductor device 1 by making the p-type impurity concentration in the second region 15b lower than the p-type impurity concentration in the first region 15a.

Furthermore, the p-type impurity concentration at the front surface of the second region 15b is made lower than the p-type impurity concentration in the front surface of the first region 15a, and thus, the contact resistance between the second region 15b and the anode electrode 30 is higher than the contact resistance between the first region 15a and the anode electrode 30. Thereby, the forward current flowing through the second region 15b has the density reduced, and the carriers are reduced in the n-type semiconductor layer 13. As a result, in the semiconductor device 1, the turn-off period is shortened, and the switching loss is reduced.

The anode electrode 30 may have a stacked structure including a first metal layer 30a and a second metal layer 30b (see FIG. 1A). The second metal layer 30b is placed between the p-type semiconductor layer 15 and the first metal layer 30a. The first metal layer 30a includes, for example, aluminum, and the second metal layer 30b includes, for example, titanium. The second metal layer 30b includes, for example, a material that provides large variation of the contact resistance depending on the surface concentration of the p-type semiconductor layer 15. Thereby, it is possible to easily form the anode electrode 30 that has the large difference between the contact resistances to the first region 15a and the second region 15b in the p-type semiconductor layer 15. In other words, Ohmic junction can be formed between the second metal layer 30b and the first region 15a of the p-type semiconductor layer 15, and Schottky junction can be formed between the second metal layer 30b and the first region 15a of the p-type semiconductor layer 15.

In the case where the difference in the surface concentration $C_{SA}$ of the first region 15a and the surface concentration $C_{SB}$ of the second region 15*b* is large, it is possible to omit the second metal layer 30*b*. For example, the first metal layer 30*a* including aluminum is formed to directly contact the first region 15*a* and the second region 15*b*, and the anode electrode 30 may be formed to have the lower contact resistance to the first region 15*a* and the higher contact resistance to the second region 15*b*. Thereby, it is possible to reduce a manufacturing cost of the semiconductor device 1.

Second Embodiment

Figure 3:
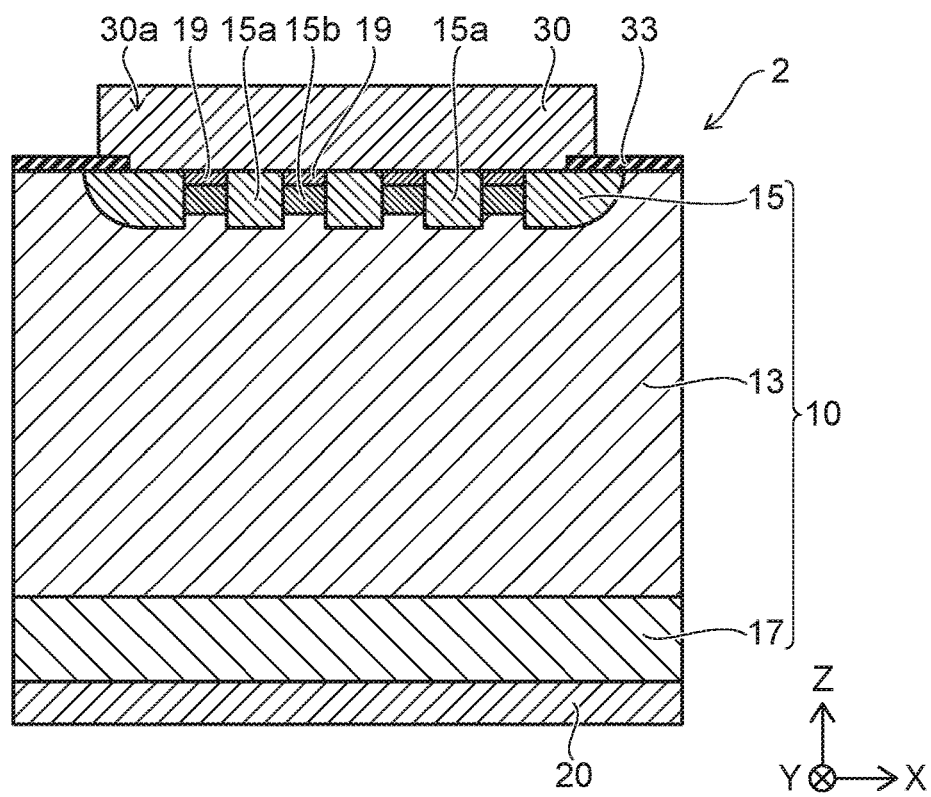
FIG. 3 is a schematic view showing a semiconductor device according to a second embodiment.

FIG. 3 is a schematic view showing a semiconductor device 2 according to a second embodiment. As shown in FIG. 3, the semiconductor device 2 includes the semiconductor body 10, the cathode electrode 20, and the anode electrode 30. The cathode electrode 20 is provided on the back surface of the semiconductor body 10. The anode electrode 30 is selectively provided on the front surface of the semiconductor body 10.

The semiconductor body 10 includes the n-type semiconductor layer 13, the p-type semiconductor layer 15, the n-type semiconductor layer 17, and an n-type semiconductor layer 19. The p-type semiconductor layer 15 includes the first region 15*a* and the second region 15*b*. The first region 15*a* has a thickness in the Z-direction thicker than a thickness of the second region 15*b* in the Z-direction. For example, the p-type impurity concentration in the first region 15*a* is higher than the p-type impurity concentration in the second region 15*b*. The n-type semiconductor layer 19 is provided between the second region 15*b* and the anode electrode 30. The anode electrode 30 is provided to contact the first region 15*a* and the n-type semiconductor layer 19.

In this example, the forward current flowing from the anode electrode 30 to the cathode electrode 20 through the second region 15*b* is suppressed by the pn junction between the second region 15*b* and the n-type semiconductor layer 19. Moreover, the hole injection from the second region 15*b* to the n-type semiconductor layer 13 is suppressed. Thus, the carriers in the n-type semiconductor layer 13 under the forward bias are reduced, and the switching loss can be reduced in the semiconductor device 2.

Figure 4:
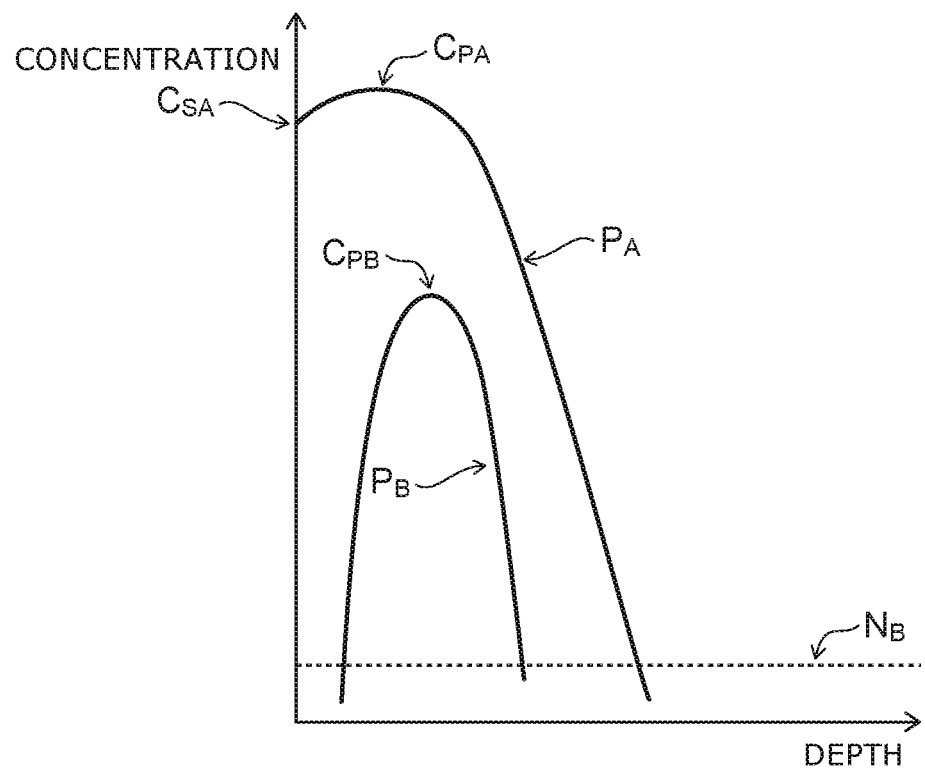
FIG. 4 is a schematic view showing a configuration of the semiconductor device according to the second embodiment.

FIG. 4 is a schematic view showing a configuration in the semiconductor device 2 according to the second embodiment. In FIG. 4, concentration profiles are illustrated to show distributions of the p-type impurities and the n-type impurities in the semiconductor body 10. $P_A$ shown in FIG. 4 is the p-type impurity distribution in the first region 15*a*. $P_B$ is the p-type impurity distribution in the second region 15*b*. $N_B$ is the n-type impurity concentration in the n-type semiconductor layer 13. $N_B$ is, for example, equal to or less than $1\times10^{16}$ cm$^{-3}$.

As shown in FIG. 4, the peak concentration $C_{PA}$ of the p-type impurity distribution in the first region 15*a* is higher than the peak concentration $C_{PB}$ of the p-type impurity in the second region 15*b*. The peak concentration $C_{PA}$ is, for example, in a range of $1\times10^{18}$ to $1\times10^{19}$ cm$^{-3}$. The peak concentration $C_{PB}$ is, for example, in a range of $1\times10^{16}$ to $1\times10^{18}$ cm$^{-3}$. The surface concentration $C_{SA}$ of the p-type impurity in the first region 15*a* is higher than the peak concentration $C_{PB}$ of the p-type impurity in the second region 15*b*. The p-type impurity concentration in the second region 15*b* is lower than the peak concentration $C_{PB}$ between the peak position of the p-type impurity concentration and the anode electrode 30.

In this example, the p-type impurity implanted into a region that is to be the second region 15*b* is ion-implanted under higher acceleration energy. Thus, the second region 15*b* is formed so that the p-type impurity distribution has deeper peak position. As a result, the second region 15*b* has the p-type impurity concentration on the front surface side lower than the n-type impurity concentration $N_B$ of the n-type semiconductor layer 13. Thereby, the structure is formed, in which the n-type semiconductor layer 19 is interposed between the second region 15*b* and the anode electrode 30.

Figure 5:
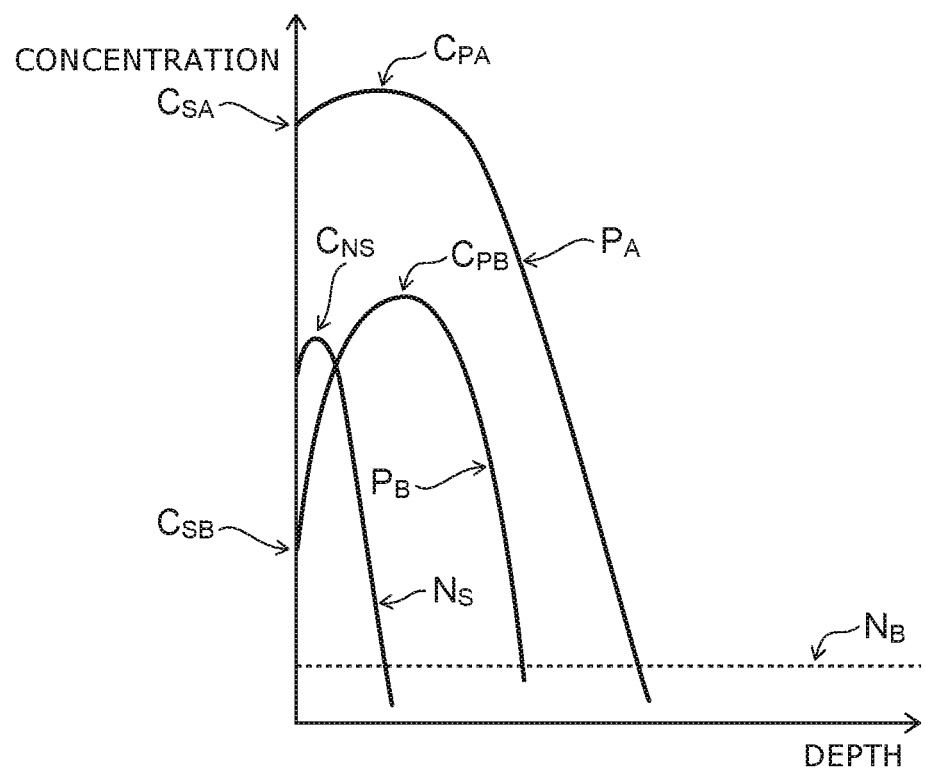
FIG. 5 is a schematic view showing other configuration of the semiconductor device according to the second embodiment.

FIG. 5 is a schematic view showing other configuration in the semiconductor device 2 according to the second embodiment. In FIG. 5, impurity concentration profiles are illustrated to show the distributions of the p-type impurities and the n-type impurities in the semiconductor body 10. $P_A$ shown in FIG. 5 is the p-type impurity distribution in the first region 15*a*. $P_B$ is the p-type impurity distribution in the second region 15*b*. $N_B$ is the n-type impurity concentration in the n-type semiconductor layer 13.

In this example, the n-type impurities are added on the front surface side of the second region 15*b*. $N_S$ shows the n-type impurity profile in the n-type semiconductor layer 19. The n-type semiconductor layer 19 is formed, for example, by selectively ion-implanting the n-type impurities through the front surface of the second region 15*b*.

The peak concentration $C_{NS}$ in the concentration profile $N_S$ is, for example, $1\times10^{17}$ cm$^{-3}$, and the surface concentration of the n-type impurities in the n-type semiconductor layer 19 is, for example, higher than $N_B$ and lower than $1\times10^{17}$ cm$^{-3}$.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a semiconductor body including a first semiconductor layer of a first conductivity type;
   a first electrode provided on a back surface of the semiconductor body; and
   a second electrode provided on a front surface of the semiconductor body,
   the semiconductor body further including a second semiconductor layer of a second conductivity type provided between the first semiconductor layer and the second electrode,
   the second semiconductor layer including a first region and a second region arranged along the front surface of the semiconductor body, the first region including second conductivity type impurities and having a first contact surface contacting the second electrode, the first region having a first concentration profile in a thickness direction directed from the front surface of the semiconductor body to the back surface of the semiconductor body where a first peak concentration of the second conductivity type impurities in the first region is provided at a first depth, the first region being electrically connected to the second electrode, the second region including the second conductivity type impurities with a second concentration profile in the thickness direction different from the first concentration profile, where a second peak concentration of the second conductivity type impurities in the second region is provided at a second depth deeper than the first depth in the thickness direction,
wherein the first region and the second region of the second semiconductor layer each contact the first semiconductor layer,
wherein the second peak concentration is lower than the first peak concentration, and
wherein the first region is thicker than the second region in the thickness direction.

2. The device according to claim 1, wherein
the second region of the second semiconductor layer has a front surface contacting the second electrode, and
a concentration of the second conductivity type impurities in the second region of the second semiconductor layer at the front surface of the semiconductor body is lower than a concentration of the second conductivity type impurities in the first region of the second semiconductor layer at the front surface of the semiconductor body.

3. The device according to claim 2, wherein
the second electrode has a stacked structure including a first metal layer and a second metal layer, the second metal layer being positioned between the second semiconductor layer and the first metal layer, the second metal layer contacting the second semiconductor layer, and
the second metal layer has a first contact resistance along the first region of the second semiconductor layer at the front surface of the semiconductor body and a second contact resistance along the second region of the second semiconductor layer at the front surface of the semiconductor body, the second contact resistance being larger than the first contact resistance.

4. The device according to claim 3, wherein the first metal layer includes aluminum and the second metal layer includes titanium.

5. The device according to claim 1, wherein
the second peak concentration of the second conductivity type impurities in the second region of the second semiconductor layer is positioned between the first semiconductor layer and the second electrode.

6. The device according to claim 1, wherein
the first peak concentration of the second conductivity type impurities in the first region of the second semiconductor layer is positioned between the first semiconductor layer and the second electrode, and
the second peak concentration of the second conductivity type impurities in the second region of the second semiconductor layer is positioned between the first semiconductor layer and the second electrode.

7. The device according to claim 1, wherein
a concentration of the second conductivity type impurities in the second region of the second semiconductor layer at the front surface of the semiconductor body is equal to or less than one-tenth the concentration of the second conductivity type impurities in the first region of the second semiconductor layer at the front surface of the semiconductor body.

8. The device according to claim 1, wherein
the semiconductor body further includes a third semiconductor layer of the first conductivity type, the third semiconductor layer being provided between the second region of the second semiconductor layer and the second electrode.

9. The device according to claim 8, wherein the second electrode contacts the first region of the second semiconductor layer and the third semiconductor layer.

10. The device according to claim 8, wherein the third semiconductor layer includes first conductivity type impurities and second conductivity type impurities, the first conductivity impurities of the third semiconductor layer having a concentration higher than a concentration of the second conductivity type impurities in the third semiconductor layer.

11. The device according to claim 8, wherein
the first semiconductor layer includes first conductivity type impurities, and
the third semiconductor layer includes the first conductivity type impurities having a concentration same as a concentration of the first conductivity type impurities in the first semiconductor layer.

12. The device according to claim 8, wherein
the second peak concentration of the second conductivity type impurities in the first region of the second semiconductor layer is positioned between the first semiconductor layer and the second electrode.

13. The device according to claim 9, wherein
the first semiconductor layer includes first conductivity type impurities, and
the third semiconductor layer includes the first conductivity type impurities having a concentration higher than a concentration of the first conductivity type impurities in the first semiconductor layer.

14. The device according to claim 1, wherein
the second semiconductor layer comprises a plurality of second further regions arranged in a first direction and a second direction, each of the plurality of second further regions being similar to the second region, and, wherein the first direction is parallel to the front surface of the semiconductor body.

15. The device according to claim 1, wherein
the first region has a lattice pattern.

16. The device according to claim 14, wherein
the second direction is perpendicular to the first direction.

17. The device according to claim 1, wherein
the second conductivity type impurities in the first region of the second semiconductor layer has a first concertation ratio, the first concertation ratio corresponding to a ratio of a concentration of the second conductivity type impurities in the first region at the front surface of the semiconductor body to the first peak concentration, and
the second conductivity type impurities in the second region of the second semiconductor layer has a second concertation ratio, the second concertation ratio corresponding to a ratio of a concentration of the second conductivity type impurities in the second region at the front surface of the semiconductor body to the second peak concentration, and wherein
the second concertation ratio is less than the first concertation ratio.

18. The device according to claim 1, wherein
the first region surrounds a plurality of second further regions, each of the plurality of second further regions being similar to the second region, and the first region is in contact with the plurality of the second further regions.

19. The device according to claim 2, wherein
the second semiconductor layer includes a plurality of second further regions, each of the plurality of second further regions being similar to the second region, the plurality of second further regions being arranged along the front surface of the semiconductor body in a first direction and a second direction, the first direction being perpendicular to the second direction, and
the first region is provided with a grid pattern between the plurality of second further regions.

* * * * *